US012635093B2

(12) United States Patent
Cho et al.

(10) Patent No.: US 12,635,093 B2
(45) Date of Patent: May 19, 2026

(54) ELECTRONIC APPARATUS COMPRISING WATERPROOF STRUCTURE

(71) Applicant: Samsung Electronics Co., Ltd.,
Suwon-si (KR)

(72) Inventors: Sunggun Cho, Suwon-si (KR); Dongik Lee, Suwon-si (KR); Minyee An, Suwon-si (KR); Wonhee Choi, Suwon-si (KR); Hyunseung Yoon, Suwon-si (KR); Heekang Yun, Suwon-si (KR); Waneui Jung, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 349 days.

(21) Appl. No.: 18/360,275

(22) Filed: Jul. 27, 2023

(65) Prior Publication Data

US 2023/0371192 A1      Nov. 16, 2023

Related U.S. Application Data

(63) Continuation of application No. PCT/KR2022/001075, filed on Jan. 20, 2022.

(30) Foreign Application Priority Data

Jan. 28, 2021      (KR) ........................ 10-2021-0012050

(51) Int. Cl.
*H05K 5/02*          (2006.01)
*G06K 7/00*          (2006.01)
          (Continued)

(52) U.S. Cl.
CPC ......... *H05K 5/0247* (2013.01); *H05K 5/0278* (2013.01); *H05K 5/069* (2013.01)

(58) Field of Classification Search
CPC ...... H05K 5/0247; H05K 5/069; H05K 5/061; H05K 5/0056; H05K 5/0069; H01R 12/722
See application file for complete search history.

(56) References Cited

U.S. PATENT DOCUMENTS 8,246,383 B2      8/2012  Schmidt et al.
8,979,554 B2      3/2015  Yudate
          (Continued)

FOREIGN PATENT DOCUMENTS

JP          2014057015 A      3/2014
JP          2020205211 A      12/2020
          (Continued)

OTHER PUBLICATIONS

Korean Office Action issued Jan. 6, 2025 in corresponding Korean Patent Application No. 10-2021-0012050.
          (Continued)

*Primary Examiner* — Amol H Patel
(74) *Attorney, Agent, or Firm* — Nixon & Vanderhye P.C.

(57)          ABSTRACT

According to an embodiment of the present disclosure, an electronic apparatus comprises: a housing; a first connector positioned on a printed circuit board accommodated in the housing and comprising a first hole configured to receive a first external connector; a second connector comprising a second hole configured to receive a second external connector; a first seal having a ring shape positioned in the first connector around the first hole; and a second seal having a ring shape positioned in the second connector around the second hole, wherein, based on the first seal being compressed in a first direction by the housing, the second seal may be compressed by the housing in a second direction perpendicular to the first direction.

14 Claims, 10 Drawing Sheets

(51) Int. Cl.

| | |
|---|---|
| *H01R 12/72* | (2011.01) |
| *H01R 13/52* | (2006.01) |
| *H01R 24/58* | (2011.01) |
| *H01R 24/62* | (2011.01) |
| *H04M 1/02* | (2006.01) |
| *H04M 1/18* | (2006.01) |
| *H05K 5/06* | (2006.01) |

(56) References Cited

U.S. PATENT DOCUMENTS

| | | | | |
|---|---|---|---|---|
| 9,225,105 | B2 | 12/2015 | Cheong et al. | |
| 10,820,439 | B2 | 10/2020 | Pham et al. | |
| 2014/0080329 | A1 | 3/2014 | Yamanaka et al. | |
| 2017/0111077 | A1* | 4/2017 | Hwang | H01Q 1/243 |
| 2018/0159267 | A1* | 6/2018 | Zhao | H01R 13/6581 |
| 2018/0228038 | A1* | 8/2018 | Lim | H01R 12/724 |
| 2020/0178411 | A1* | 6/2020 | Pham | H04M 1/18 |
| 2021/0167544 | A1* | 6/2021 | Hsu | H01R 43/24 |

FOREIGN PATENT DOCUMENTS

| | | | | | |
|---|---|---|---|---|---|
| KR | 20120125668 | A | 11/2012 | | |
| KR | 20130122669 | A | 11/2013 | | |
| KR | 20140113789 | A | 9/2014 | | |
| KR | 200482547 | Y1 | 2/2017 | | |
| KR | 20180017692 | A * | 2/2018 | ........ | H01R 13/5202 |
| KR | 20180092250 | A | 8/2018 | | |
| KR | 20200049603 | A | 5/2020 | | |
| KR | 20200066407 | A | 6/2020 | | |

OTHER PUBLICATIONS

International Search Report for PCT/KR2022/001075 mailed Apr. 26, 2022, 4 pages.

Written Opinion of the ISA for PCT/KR2022/001075 mailed Apr. 26, 2022, 4 pages.

Extended European Search Report dated May 21, 2024 issued in European Patent Application No. 22746156.3.

\* cited by examiner

FIG. 5

ELECTRONIC APPARATUS COMPRISING WATERPROOF STRUCTURE

CROSS-REFERENCE TO RELATED APPLICATIONS

This application is a continuation of International Application No. PCT/KR2022/001075 designating the United States, filed on Jan. 20, 2022, in the Korean Intellectual Property Receiving Office and claiming priority to Korean Patent Application No. 10-2021-0012050, filed on Jan. 28, 2021, in the Korean Intellectual Property Office, the disclosures of each of which are incorporated by reference herein in their entireties.

BACKGROUND

Field

The disclosure relates to an electronic device including a waterproof structure.

Description of Related Art

Electronic devices such as smartphones have become slimmer while having enhanced design aspects. Electronic devices have been developed to have differentiated functions in order to satisfy buying desires of consumers. For example, an electronic device may have a waterproof structure.

An electronic device may include a connector (for example, an interface terminal such as a USB connector) for connecting an external electronic device. The electronic device may transmit and/or receive power and/or data with the external electronic device connected to the connector. The electronic device may include a connector hole formed in the housing so as to correspond to the connector.

SUMMARY

Embodiments of the disclosure may provide an electronic device including a waterproof structure such that foreign matter such as water do not flow into the electronic device through a connector hole.

According to an example embodiment of the disclosure, an electronic apparatus may include: a housing, a first connector including a first hole configured to receive a first external connector, and a second connector including a second hole configured to receive a second external connector, the first connector and the second connector being positioned on a printed circuit board accommodated in the housing and, and a first seal having an annular shape and positioned on the first connector around the first hole, and a second seal having an annular shape and positioned on the second connector around the second hole, wherein based on the first seal being compressed in a first direction by the housing, the second seal is configured to be compressed in a second direction orthogonal to the first direction by the housing.

An electronic device including a waterproof structure according to an example embodiment of the disclosure may prevent and/or reduce foreign matter such as water from flowing into the electronic device through a connector hole, thereby improving the reliability of the electronic device regarding the waterproof function thereof.

Other advantageous effects obtainable or predictable from various example embodiments of the disclosure will be disclosed explicitly or implicitly in detailed description.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 5 is a partial perspective cut-away view illustrating a state in which a second board assembly is positioned in a front case according to various embodiments;

DETAILED DESCRIPTION

Figure 1:
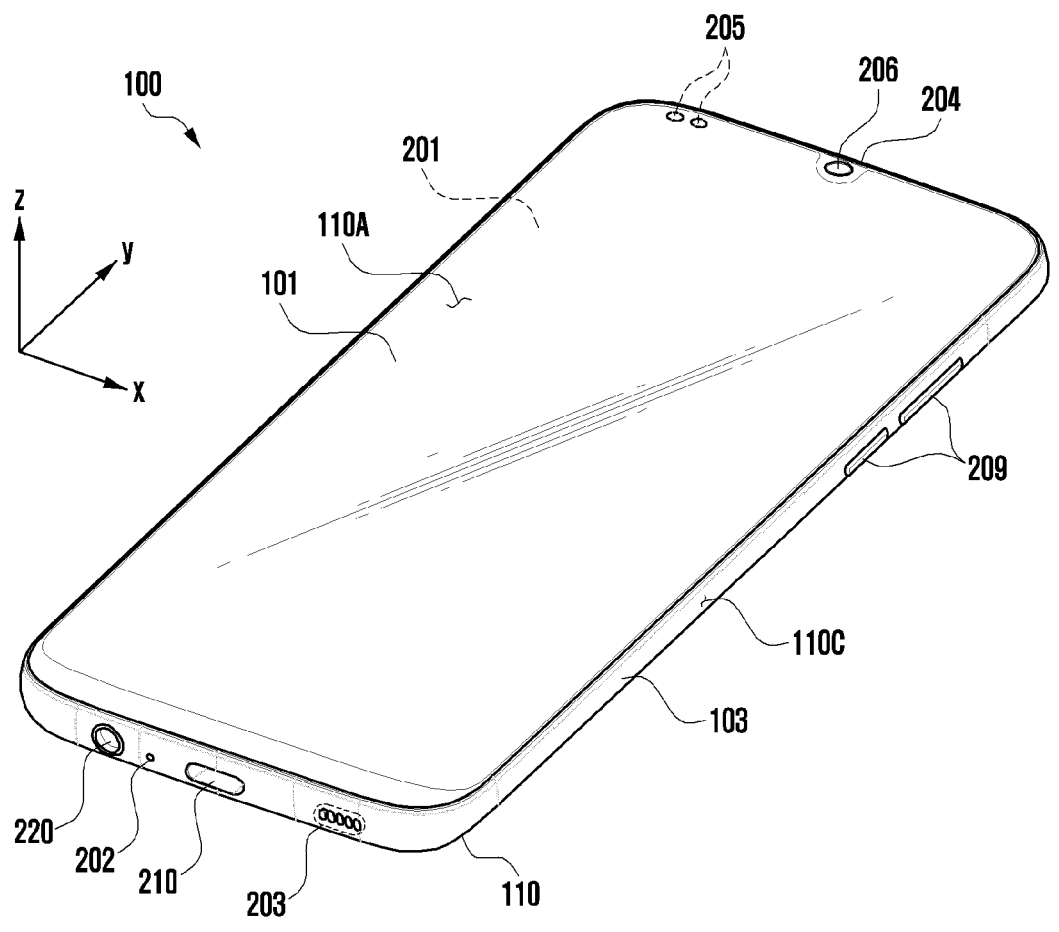
FIG. 1 is a front perspective view of a mobile electronic apparatus according to various embodiments.

Hereinafter, various example embodiments of the disclosure will be described in greater detail with reference to the accompanying drawings.

The electronic device according to various embodiments disclosed herein may be one of various types of electronic devices. The electronic devices may include, for example, a portable communication device (e.g., a smart phone), a computer device, a portable multimedia device, a portable medical device, a camera, a wearable device, a home appliance, or the like. The electronic device according to embodiments of the disclosure is not limited to those described above.

It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. A singular form of a noun corresponding to an item may include one or more of the items, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order).

Figure 2:
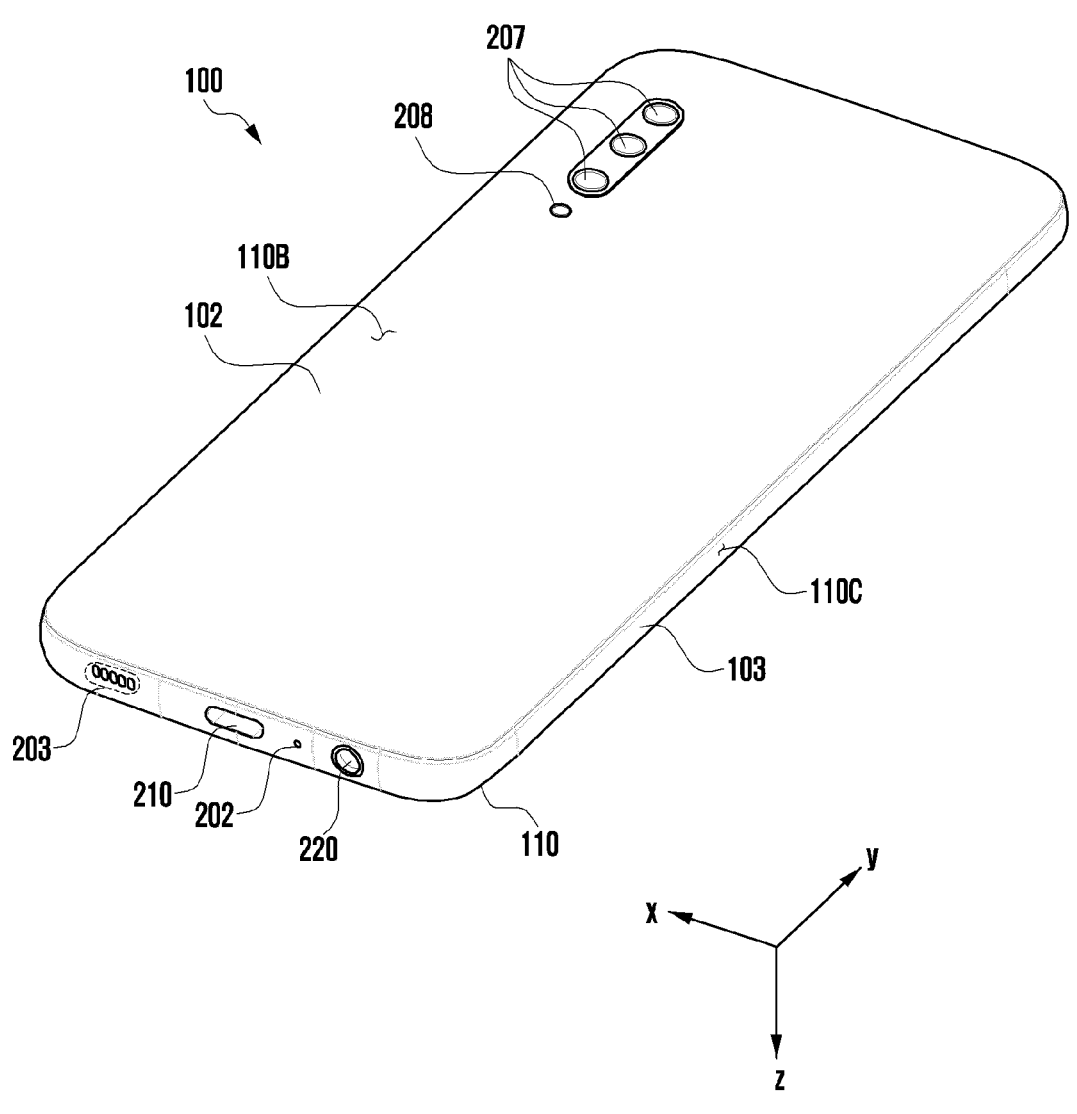
FIG. 2 is a rear perspective view of the electronic apparatus in FIG. 1 according to various embodiments.

FIG. 1 is a front perspective of a mobile electronic apparatus 100 according to various embodiments. FIG. 2 is a rear perspective view of the electronic apparatus 100 in FIG. 1 according to various embodiments.

Referring to FIGS. 1 and 2, an electronic apparatus 100 according to an embodiment may include a housing 110 including a first surface (or a front surface) 110A, a second surface (or a rear surface) 110B, and a side surface 110C surrounding the space between the first surface 110A and the second surface 110B. In various embodiments, the housing 110 may include a structure forming at least a part of the first surface 110A, the second surface 110B, and the side surface 110C. In an embodiment, the first surface 110A may be formed by a front plate (or a first plate) 101 (e.g., a glass plate including various coating layers, or a polymer plate) which is at least partially transparent. The second surface 110B may be formed by a substantially opaque rear plate (or a second plate) 102. In an embodiment, for example, the rear plate 102 may be formed by coated or colored glass, ceramic, polymer, metal (e.g., aluminum, stainless steel (STS), or magnesium), or a combination of at least two of the materials. For example, the rear plate 102 may include a plate made of various materials such as transparent glass, ceramic, or polymer, and at least one coating layer disposed on the plate using a coating. For another example, the rear cover 102 may include a plate made of various materials such as transparent glass, ceramic, or polymer, and a film (e.g., a decoration film) which is attached to the plate and has various visual effects. The side surface 110C may be formed by a lateral bezel structure (or a lateral member) 103, and the lateral bezel structure 103 may include metal, ceramic, and/or polymer. For example, the lateral bezel structure 103 may include various metal materials such as titanium, an amorphous alloy, a metal-ceramic composite material (e.g., cermet), stainless steel, magnesium, a magnesium alloy, aluminum, an aluminum alloy, a zinc alloy, or a copper alloy. In various embodiments, the rear plate 102 and the lateral bezel structure 103 may be integrally formed, and may include the same material (e.g., a metal material such as aluminum, or a non-metal material such as polymer).

According to an embodiment, the electronic apparatus 100 may include at least one of a display 201, a first audio module 202, a second audio module 203, a third audio module 204, a sensor module 205, a first camera module 206, multiple second camera modules 207, a light-emitting module 208, an input module 209, a first connection terminal module 210, or a second connection terminal module 220. In various embodiments, at least one of the elements of the electronic apparatus 100 may be omitted, or the electronic apparatus may additionally include other elements.

For example, the display 201 may be visually exposed (e.g., visible) through at least a part of the front plate 101. In various embodiments, the rim of the display 201 may be formed to be substantially identical to the shape of the outer perimeter of the front plate 101, which is adjacent thereto. In various embodiments, in order to expand an area which allows the display 201 to be visible, the interval between the outer perimeter of the display 201 and the outer perimeter of the front plate 101 may be formed to be substantially identical. In various embodiments, the display 201 may be coupled to or disposed adjacent to a touch detection circuit, a pressure sensor capable of measuring the intensity (pressure) of a touch, and/or a digitizer for detecting a magnetic field-type stylus pen.

For example, the first audio module 202 may include a microphone positioned inside the electronic apparatus 100, and a microphone hole formed through the side surface 110C to correspond to the microphone. The position or the number of the first audio module is not limited to the illustrated example, and may be various. In various embodiments, the electronic apparatus 100 may include multiple microphones used for detecting the direction of sound.

For example, the second audio module 203 may include a first speaker positioned inside the electronic apparatus 100, and a first speaker hole formed through the side surface 110C to correspond to the first speaker. For example, the third audio module 204 may include a second speaker positioned inside the electronic apparatus 100, and a second speaker hole formed through the front surface 110A to correspond to the second speaker. In an embodiment, the first speaker may include an external speaker. In an embodiment, the second speaker may include a receiver for calling, and the second speaker hole may be referred to as a receiver hole. The position or the number of the second audio module 203 or the third audio module 204 may be various without being limited to the illustrated embodiment. In various embodiments, the microphone hole and the speaker hole may be implemented as one hole. In various embodiments, the second audio module 203 or the third audio module 204 may include a piezo speaker in which a speaker hole is omitted.

For example, the sensor module 205 may generate an electrical signal or data value corresponding to an internal operation state of the electronic apparatus 100 or an external environmental state. In an embodiment, the sensor module 205 may include an optical sensor positioned inside the electronic apparatus 100 to correspond to the first surface 110A. For example, the optical sensor may include a proximity sensor or an illuminance sensor. The optical sensor may be aligned with an opening formed through the display 201. External light may be introduced into the optical sensor through openings of the front plate 101 and the display 201. In various embodiments, the optical sensor may be disposed at the lower end of the display 201, and may perform related functions while the position of the optical sensor is not visually distinguished (or exposed). For example, the optical sensor may be positioned on the rear surface of the display 201, or below or beneath the display 201. In various embodiments, the optical sensor may be positioned to be aligned with a recess formed on the rear surface of the display 201. The optical sensor may be disposed to overlap at least a part of a screen, and may be configured to perform a sensing function without being exposed to the outside. In this case, a partial area of the display 201, which at least partially overlaps the optical module, may include a different pixel structure and/or wire structure compared to other areas. For example, a partial area of the display 201, which at least partially overlaps the optical sensor, may have a different pixel density compared to other areas. In various embodiments, multiple pixels may not be arranged in a partial area of the display 201, which at least partially overlaps the optical sensor. In various embodiments, the electronic apparatus 100 may include a biometric sensor (e.g., a fingerprint sensor) positioned below the display 201. The biometric sensor may be implemented in an optical type or an ultrasonic type, and the position or the number thereof may be various. The electronic apparatus 100 may further include at least one of various other sensor modules, for example, a gesture sensor, a gyro sensor, a barometric pressure sensor, a magnetic sensor, an acceleration sensor, a grip sensor, a color sensor, an infrared (IR) sensor, a temperature sensor, or a humidity sensor.

For example, the first camera module 206 (e.g., a front camera module) may be positioned inside the electronic apparatus 100 to correspond to the first surface 110A. For example, the multiple second camera modules 207 (e.g., rear camera modules) may be positioned inside the electronic apparatus 100 to correspond to the second surface 110B. The first camera module 206 and/or the multiple second camera modules 207 may include one lens or multiple lenses, an image sensor, and/or an image signal processor. The position or the number of the first camera module or the second camera modules is not limited to the illustrated example, and may be various.

According to an embodiment, the display 201 may include an opening aligned with the first camera module 206. External light may reach the first camera module 206 through openings of the front plate 101 and the display 201. In various embodiments, the opening of the display 201 may also be formed in a notch shape according to a position of the first camera module 206. In various embodiments, the first camera module 206 may be disposed at the lower end the display 201, and may perform a related function (e.g., image photographing) while the position of the first camera module 206 is not visually distinguished (exposed). For example, the first camera module 206 may be positioned on the rear surface of the display 201, or below or beneath the display 201. In various embodiments, the first camera module 206 may be positioned to be aligned with a recess formed on the rear surface of display 201. The first camera module 206 may be disposed to overlap at least a part of a screen, and may obtain an image of an external subject without being visually exposed to the outside. In this case, a partial area of the display 201, which at least partially overlaps the first camera module 206, may include a different pixel structure and/or wire structure compared to the other areas. For example, a partial area of the display 201, which at least partially overlaps the first camera module 206, may have a different pixel density compared to other areas. The pixel structure and/or the wire structure formed in a partial area of the display 201, which at least partially overlaps the first camera module 206, may reduce the loss of light between the outside and the first camera module 206. In various embodiments, a pixel may not be disposed in a partial area of the display 201, which at least partially overlaps the first camera module 206. In various embodiments, the electronic apparatus 100 may further include a light-emitting module (e.g., a light source) positioned inside the electronic apparatus 100 to correspond to the first surface 110A. For example, the light-emitting module may be configured to provide status information of the electronic apparatus 100 in the form of light. In various embodiments, the light-emitting module may provide a light source operating in association with an operation of the first camera module 206. For example, the light-emitting module may include an LED, an IR LED, or a xenon lamp.

According to an embodiment, the multiple second camera modules 207 may have different attributes (e.g., an angle of view) or functions, and for example, may include a dual camera or a triple camera. The multiple second camera modules 207 may include multiple camera modules including lenses having different angles of view. The electronic apparatus 100 may be implemented to change an angle of view of a camera module, which is performed in the electronic apparatus 100, based on a user selection. The multiple second camera modules 207 may include at least one of a wide-angle camera, a telephoto camera, a color camera, a monochrome camera, or an infrared (IR) camera (e.g., a time of flight (TOF) camera or a structured light camera). In various embodiments, the IR camera may also be operated as at least a part of a sensor module. The light-emitting module 208 (e.g., a flash) may include a light source for the multiple second camera modules 207. For example, the light-emitting module 208 may include an LED and/or a xenon lamp.

For example, the input module 209 may include one or more key input devices. For example, the one or more key input devices may be positioned in an opening formed through the side surface 110C. In various embodiments, the electronic apparatus 100 may not include some or all of the key input devices, and the key input device not included therein may be implemented as a soft key using the display 201. The position or the number of the input module 209 may be various, and in various embodiments, the input module 209 may include at least one sensor module.

For example, the first connection terminal module (e.g., a first connector module or a first interface terminal) 210 may include a first connector (or a first interface terminal) positioned inside the electronic apparatus 100, and a first connector hole formed through the side surface 110C to correspond to the first connector. For example, the second connection terminal module (e.g., a second connector module or a second interface terminal) 220 may include a second connector (or a second interface terminal) positioned inside the electronic apparatus 100, and a second connector hole formed through the side surface 110C to correspond to the second connector. The electronic apparatus 100 may transmit and/or receive power and/or data to and/or from an external electronic apparatus electrically connected to a first connector or a second connector. In an embodiment, the first connector may include a universal serial bus (USB) connector or a high definition multimedia interface (HDMI) connector. In an embodiment, the second connector may include an audio connector (e.g., a headphone connector or an earset connector). The position or the number of the connection terminal modules is not limited to the illustrated example, and may be various.

Figure 3:
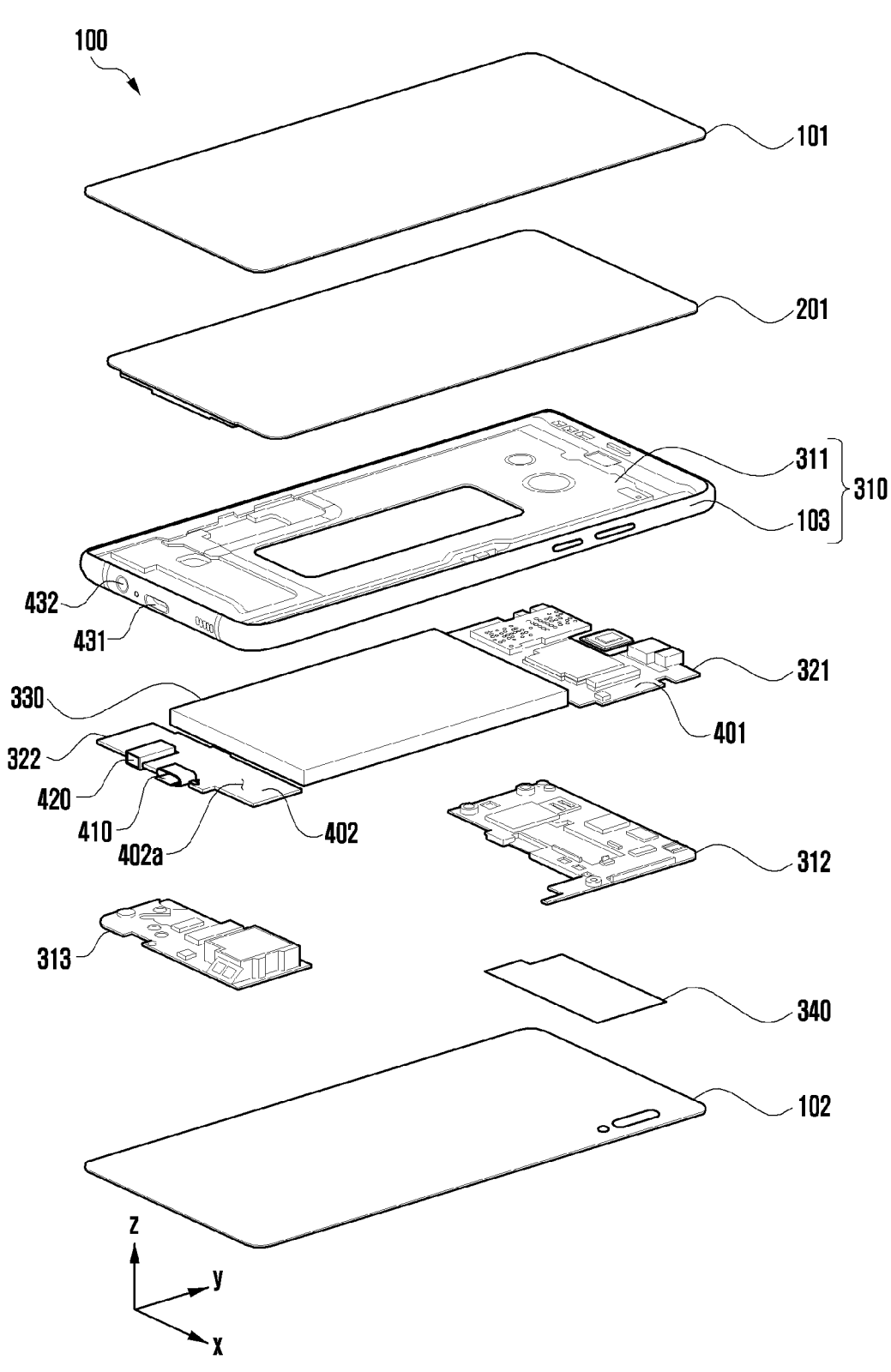
FIG. 3 is an exploded perspective view of the electronic apparatus in FIG. 1 according to various embodiments.

FIG. 3 is an exploded perspective view of the electronic apparatus 100 of FIG. 1 according to various embodiments.

Referring to FIG. 3, in an embodiment, the electronic apparatus 100 may include the front plate 101, the rear plate 102, the lateral bezel structure 103, a first support member 311, a second support member 312, and a third support member 313, the display 201, a first board assembly 321, a second board assembly 322, a battery 330, and/or an antenna structure 340. In various embodiments, at least one (e.g., the second support member 312 or the third support member 313) of the elements may be omitted from the electronic apparatus 100, or other elements may be additionally included therein.

For example, the first support member 311 (e.g., a bracket) may be positioned inside the electronic apparatus 100, and may be connected to the lateral bezel structure 103 or be integrally formed with the lateral bezel structure 103. For example, the first support member 311 may be formed of a metal material and/or a non-metal material (e.g., polymer). In an embodiment, the configuration including the first support member 311 and the lateral bezel structure 103 may be referred to as a front case 310.

For example, the display 201 may be positioned between the first support member 311 and the front plate 101, and may be disposed on one surface of the first support member 311. For example, the first board assembly 321 and the second board assembly 322 may be positioned between the first support member 311 and the rear plate 102, and be coupled to the other surface of the first support member 311. For example, the battery 330 may be positioned between the first support member 311 and the rear plate 102, and may be disposed in the first support member 311.

According to an embodiment, the first board assembly 321 may include a first printed circuit board (PCB) 401. The first board assembly 321 may include various electronic components electrically connected to the first printed circuit board 401. The electronic components may be arranged on the first printed circuit board 401, or may be electrically connected to the first printed circuit board 401 through an electrical path such as a cable or a flexible printed circuit board (FPCB). Referring to FIGS. 1 and 2, for example, the electronic components may include a second speaker included in the third audio module 204, the sensor module 205, the first camera module 206, the multiple second camera modules 207, the light-emitting module 208, and/or the input module 209.

According to an embodiment, when seen from above the front plate 101 (e.g., when seen in the −z-axis direction), the second board assembly 322 may be disposed to be spaced apart from the first board assembly 321 while having the battery 330 interposed therebetween. The second board assembly 322 may include a second printed circuit board 402 electrically connected to the first printed circuit board 401 of the first board assembly 321. The second board assembly 322 may include various electronic components electrically connected to the second printed circuit board 402. The electronic components may be arranged on the second printed circuit board 402, or may be electrically connected to the second printed circuit board 402 through an electrical path such as a cable or an FPCB. Referring to FIGS. 1 and 2, for example, the electronic components may include a microphone included in the first audio module 202, a first speaker included in the second audio module 203, a first connector included in the first connection terminal module 210, and/or a second connector included in the second connection terminal module 220.

According to various embodiments, the first board assembly 321 or the second board assembly 322 may include a primary PCB (or a main PCB), a secondary PCB (or a slave PCB) disposed to partially overlap the primary PCB, and/or an interposer substrate between the primary PCB and the secondary PCB.

The battery 330 may be a device for supplying power to at least one element of the electronic apparatus 100, and for example, may include a non-rechargeable primary cell, a rechargeable secondary cell, or a fuel cell. The battery 330 may be integrally disposed inside the electronic apparatus 100. In various embodiment, the battery 330 may also be disposed detachably from the electronic apparatus 100.

According to an embodiment, the second support member 312 may be positioned between the first support member 311 and the rear plate 102, and may be coupled to the first support member 311 using a fastening element such as a bolt. At least a part of the first board assembly 321 may be positioned between the first support member 311 and the second support member 312, and the second support member 312 may cover the first board assembly 321 so as to protect same. When seen from above the rear plate 102 (e.g., when seen in the +z-axis direction), the third support member 313 may be positioned to be spaced apart from the second support member 312 while having the battery 330 interposed therebetween. The third support member 313 may be positioned between the first support member 311 and the rear plate 102, and may be coupled to the first support member 311 using a fastening element such as a bolt. At least a part of the second board assembly 322 may be positioned between the first support member 311 and the third support member 313, and the third support member 313 may cover the second board assembly 322 so as to protect same. The second support member 312 and/or the third support member 313 may be formed of a metal material and/or a non-metal material (e.g., polymer). In various embodiments, the second support member 312 may function as an electromagnetic shield for the first board assembly 321, and the third support member 313 may function as an electromagnetic shield for the second board assembly 322. In various embodiments, the second support member 312 and/or the third support member 313 may be referred to as a rear case.

According to various embodiments, an integrated board assembly including the first board assembly 321 and the second board assembly 322 may be implemented. For example, when seen from above the rear plate 102 (e.g., when seen from in the +z-axis direction), the integrated board assembly may include a first portion and a second portion which are positioned to be spaced apart from each other while having the battery 330 interposed between, and a third portion which extends between the battery 330 and the lateral bezel structure 103 and connects the first portion and the second portion. In this case, an integrated support member including the second support member 312 and the third support member 313 may be implemented.

According to an embodiment, the antenna structure 340 may be positioned between the second support member 312 and the rear plate 102. In various embodiments, the antenna structure 340 may be positioned between the battery 330 and the rear plate 102. For example, the antenna structure 340 may be implemented in the form of a film such as an FPCB. The antenna structure 340 may include at least one conductive pattern used as a loop type radiator. For example, the at least one conductive pattern may include a planar helical conductive pattern (e.g., a planar coil, or a pattern coil). In an embodiment, at least one conductive pattern included in the antenna structure 340 may be electrically connected to a wireless communication circuit (or a wireless communication module) included in the first board assembly 321. For example, the at least one conductive pattern may be utilized for short-range wireless communication such as near field communication (NFC). For another example, the at least one conductive pattern may be utilized for magnetic secure transmission (MST) for transmitting and/or receiving a magnetic signal. In various embodiments, at least one conductive pattern included in the antenna structure 340 may be electrically connected to a power transmission/reception circuit included in the first board assembly 321. The power transmission/reception circuit may wirelessly receive power from an external electronic apparatus or wirelessly transmit power to the external electronic apparatus, using the at least one conductive pattern. The power transmission/reception circuit may include a power management module, and for example, may include a power management integrated circuit (PMIC) or a charger integrated circuit (IC). The power transmission/reception circuit may charge the battery 330 using power wirelessly received using the conductive pattern.

According to an embodiment, the first connector (or a first interface terminal) 410 and the second connector (or a second interface terminal) 420 may be arranged on the second printed circuit board 402. The front case 310 may include a first connector hole 431 corresponding to the first connector 410 (e.g., a USB connector) and a second connector hole 432 corresponding to the second connector 420 (e.g., an audio connector). A first seal member (e.g., a seal) may be positioned between the first connector 410 and the first connector hole 431, and a second seal member may be positioned between the second connector 420 and the second connector hole 432. For example, the first seal member and the second seal member may include a flexible member or an elastic member, such as rubber. In case that the second board assembly 322 is disposed at a designated position of the front case 310, the first seal member may be in elastic contact with a designated portion (or a designated area) of a first hole structure forming the first connector hole 431 of the front case 310, and thus the seal performance (e.g., the waterproof performance), which prevents and/or reduces foreign substances such as water or dust from being introduced into the electronic apparatus 100 through a gap between the first connector 410 and the first hole structure may be secured. In case that the second board assembly 322 is disposed at a designated position of the front case 310, the second seal member may be in elastic contact with a designated portion (or a designated area) of a second hole structure forming the second connector hole 432 of the front case 310, and thus the seal performance (e.g., the waterproof performance), which prevents and/or reduces foreign substances such as water or dust from being introduced into the electronic apparatus 100 through a gap between the second connector 420 and the second hole structure may be secured.

According to various embodiments, the electronic apparatus 100 may further include various elements according to the provision form thereof. The elements may be variously changed according to the convergence trend of the electronic apparatus 100, and thus may not be enumerated. However, an element equivalent to the mentioned elements may be additionally included in the electronic apparatus 100. According to various embodiments, according to the provision form thereof, specific elements may be excluded from the above-described elements, or may be replaced with other elements.

Figure 4:
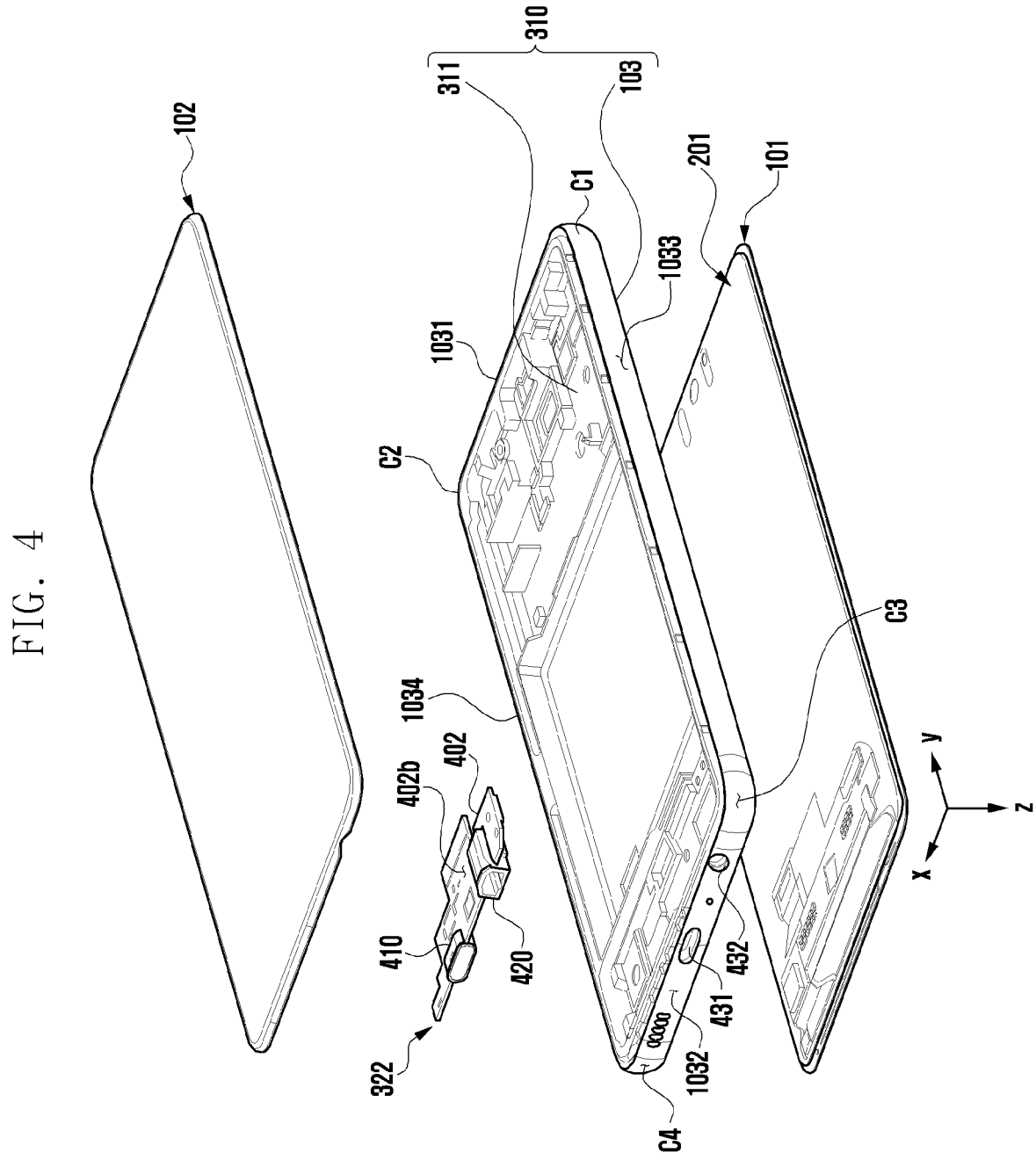
FIG. 4 is an exploded perspective view illustrating a front plate, a rear plate, a front case, a display, and a second board assembly of an electronic apparatus according to various embodiments.
Figure 5:
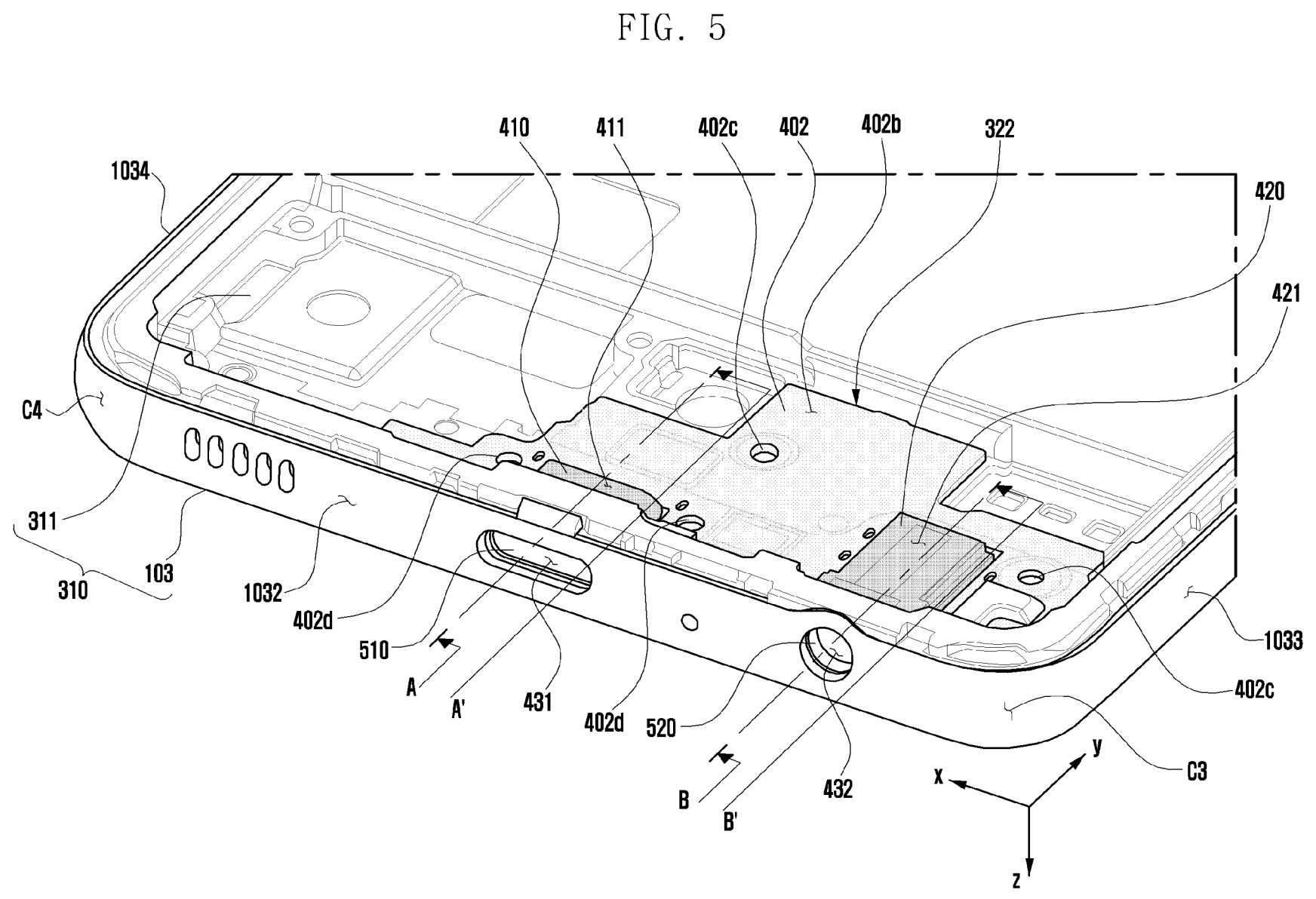
Figure 6:
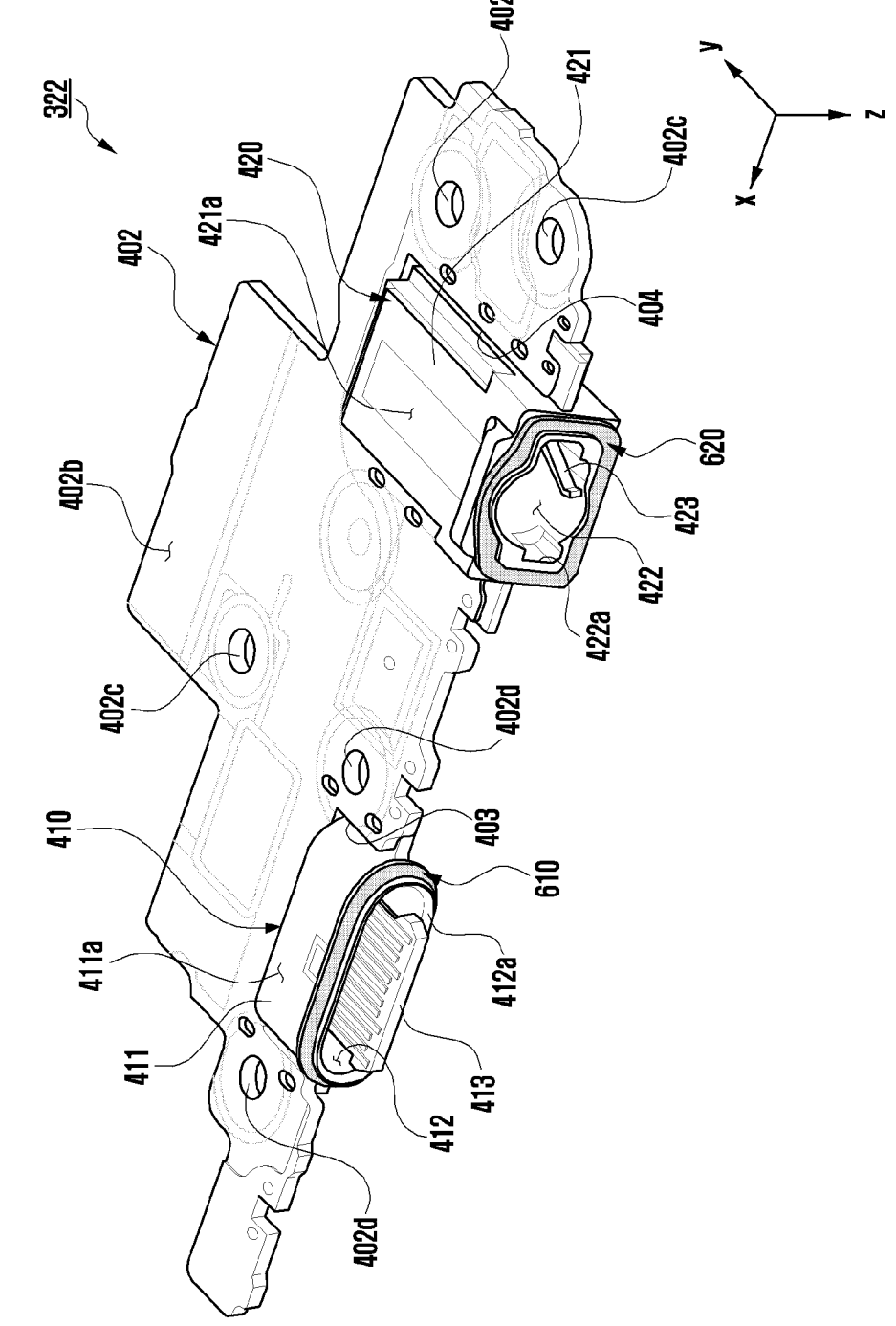
FIG. 6 is a perspective view illustrating a second board assembly according to various embodiments.
Figure 7:
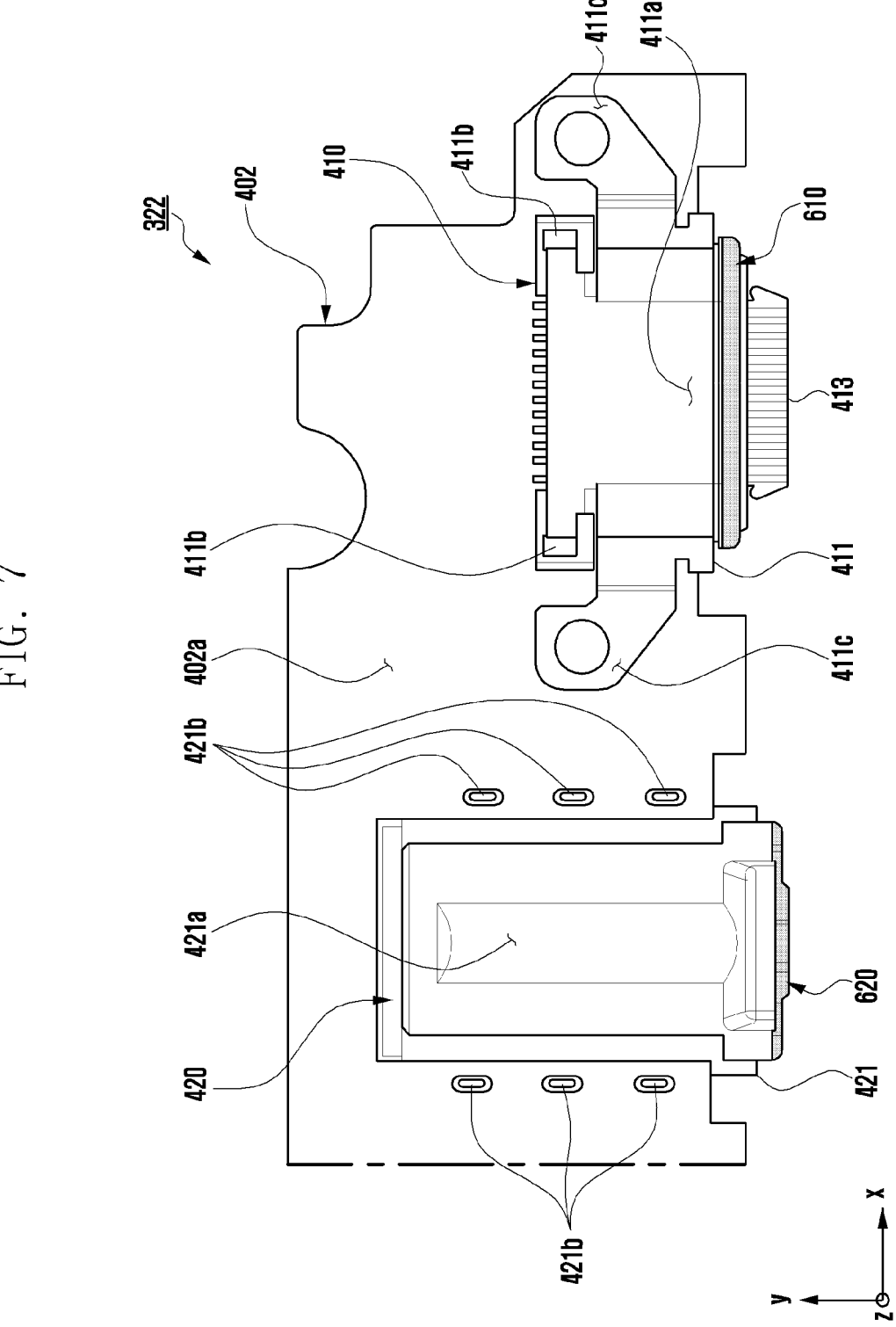
FIG. 7 is a diagram illustrating a part of a second board assembly when viewed toward a first surface of a second printed circuit board according to various embodiments.

FIG. 4 is an exploded perspective view illustrating the front plate 101, the rear plate 102, the front case 310, the display 201, and the second board assembly 322 of an electronic device according to various embodiments. FIG. 5 is a partial perspective cut away view illustrating a state in which the second board assembly 322 is positioned in the front case 310 according to various embodiments. FIG. 6 is a perspective view of the second board assembly 322 according to various embodiments. FIG. 7 is a diagram illustrating a part of the second board assembly 322 when viewed toward a first surface 402a of the second printed circuit board 402 according to various embodiments.

Referring to FIGS. 4 and 5, in an embodiment, the lateral bezel structure 103 may include a first bezel part 1031, a second bezel part 1032, a third bezel part 1033, or a fourth bezel part 1034. The first bezel part 1301 and the second bezel part 1032 may be spaced apart from and extend in parallel to each other. The third bezel part 1303 may connect one end of the first bezel part 1031 and one end of the second bezel part 1032. The fourth bezel part 1034 may connect the other end of the first bezel part 1031 and the other end of the second bezel part 1032, and may be spaced apart from and extend in parallel to the third bezel part 1033. A first corner part C1 to which the first bezel part 1031 and the third bezel part 1033 are connected, a second corner part C2 to which the first bezel part 1031 and the fourth bezel part 1034 are connected, a third corner part C3 to which the second bezel part 1032 and the third bezel part 1033 are connected, and/or a fourth corner part C4 to which the second bezel part 1032 and the fourth bezel part 1034 are connected, may be formed in a round shape. The first bezel part 1031 and the second bezel part 1032 may have a first length, and the third bezel part 1033 and the fourth bezel part 1034 may have a second length smaller than the first length. In various embodiments, the first length and second length may be formed to be substantially identical.

Referring to FIGS. 4, 5, 6, and 7, in an embodiment, the second board assembly 322 may include the second printed circuit board 402, the first connector 410, the second connector 420, a first seal member 610, and/or a second seal member 620. The second board assembly 322 may be disposed at a designated position of the front case 310. For example, the second printed circuit board 402 may include multiple bolt fastening holes 402c and 402d for bolt fastening with the first support member 311 of the front case 310.

According to an embodiment, the first connector 410 and the second connector 420 may be arranged on the second printed circuit board 402. The front case 310 may include the first connector hole 431 corresponding to the first connector 410 and the second connector hole 432 corresponding to the second connector 420. The first connector hole 431 and the second connector hole 432 may be positioned at the side of the second bezel part 1032 of the lateral bezel structure 103. When seen toward the second bezel part 1032 (e.g., when seen in the +y-axis direction), the second connector hole 432 may be positioned between the first connector hole 431 and the third corner part C3. When seen toward the second bezel part 1032, the distance in which the first connector hole 431 is spaced apart from the third corner part C3, and the distance in which the first connector hole 431 is spaced apart from the fourth corner part C4, may be substantially identical. The position of the first connector 410 and the position of the first connector hole 431 corresponding thereto, or the position of the second connector 420 and the position of the second connector hole 432 corresponding thereto is not limited to the illustrated example, and may be various.

For example, the second board assembly 322 may include a first surface 402a (see FIG. 3) and a second surface 402b oriented in a direction opposite to the first surface 402a. The first surface 402a may face the front plate 101, and the second surface 402b may face the rear plate 102. In an embodiment, the first connector 410 may be a middle-mounting type (or a sink type) connector. For example, the second printed circuit board 402 may be positioned in a first notch 403. The first notch 403 may be an opening penetrating between the first surface 402a and the second surface 402b of the second printed circuit board 402, and may include a recessed portion at an edge adjacent to the second bezel part 1032. In a structure in which the first connector 410 is disposed on the second printed circuit board 402 using the first notch 403 (see FIG. 6), a part of the first connector 410 may protrude with respect to the first surface 402a and/or the second surface 402b of the second printed circuit board 402. In an embodiment, the second connector 420 may be a middle-mounting type (or a sink type) connector. For example, the second printed circuit board 402 may be positioned in a second notch 404 (see FIG. 6) positioned to be spaced apart from the first notch 403. The second notch 404 may be an opening penetrating between the first surface 402a and the second surface 402b of the second printed circuit board 402, and may include a recessed portion at an edge adjacent to the second bezel part 1032. In a structure in which the second connector 420 is disposed on the second printed circuit board 402 using the second notch 404, a part of the second connector 420 may protrude with respect to the first surface 402*a* and/or the second surface 402*b* of the second printed circuit board 402. The structure in which the first connector 410 is disposed on the second printed circuit board 402 using the first notch 403, and the structure in which the second connector 420 is disposed on the second printed circuit board 402 using the second notch 404, may contribute to slimness of the electronic apparatus 100. In various embodiments, the first connector 410 or the second connector 420 may be a surface-mounting type connector, and for example, may be disposed on the first surface 402*a* of the second printed circuit board 402. For example, the first connector 410 and/or the second connector 420 may be a socket connector (or a receptacle) to which a header connector (or a plug) can be connected.

According to an embodiment, the first connector 410 may include a first shell 411 and a first terminal structure (or a terminal assembly) 413 connected to the first shell 411. The first shell 411 may include a first hole 412 including a first opening 412*a* facing the first connector hole 431. An external connector may be inserted into the first hole 412 of the first shell 411 through the first connector hole 431. The first hole 412 may be a space extending from the first opening 412*a* in the direction (or the direction from the second bezel part 1032 toward the first bezel part 1032) (e.g., the +y-axis direction) in which the external connector is inserted, and may have a shape into which the external connector can be fitted, so that the external connector is stably accommodated therein without shaking. For example, the first shell 411 may include various metal materials such as stainless steel or phosphor bronze. The first shell 411 may be electrically connected to a ground plane included in the second printed circuit board 402, and thus may function as an electromagnetic shield for reducing electromagnetic interference (EMI) on the first connector 410. In an embodiment, the first shell 411 may include a first hole structure part 411*a* forming the first hole 412, and multiple fixation parts 411*b* and 411*c* extending from the first hole structure part 411*a*. The first hole structure part 411*a* may have a shape which extends in a direction (e.g., the +y-axis direction) in which an external connector is inserted and includes the first hole 412. One pair of first fixation parts 411*b* may extend from opposite sides of the first hole structure part 411*a*, and may be symmetrically positioned with reference to the first hole structure part 411*a*. The one pair of first fixation parts 411*b* may be inserted into one pair of component mounting holes formed through the second printed circuit board 402, and may be coupled to the second printed circuit board 402 using a conductive bonding material. One pair of second fixation parts 411*c* may extend from opposite sides of the first hole structure part 411*a*, and may be symmetrically positioned with reference to the first hole structure part 411*a*. The one pair of second fixation parts 411*c* may face the first surface 402*a* of the second printed circuit board 402, and may include bolt fastening holes aligned with one pair of bolt fastening holes 402*d* of the second printed circuit board 402. The one pair of second fixation parts 411*c* and the second printed circuit board 402 may be coupled to the first support member 311 of the front case 310 using bolt fastening. The first shell 411 may be electrically connected to the second printed circuit board 402 through the one pair of first fixation parts 411*b* and/or the one pair of second fixation parts 411*c*. The first shell 411 is not limited to the illustrated example, and may be formed in various other shapes including the first hole 412. The first terminal assembly 413 (or a tongue) may be positioned in the first hole 412 and coupled to the first shell 411. The first terminal assembly 413 may include a non-conductive terminal support member, and multiple conductive terminals (e.g., conductive contacts or conductive pins) arranged in a non-conductive terminal support member. For example, the non-conductive terminal support member may include a non-conductive material made of various polymer, such as glass-filled nylon. The non-conductive terminal support member may include a first support part coupled to the first shell 411, and a second support part having the shape of a plate extending from the first support part in the form of a cantilever. The second support part may be positioned to be spaced apart from the shell inner surface of the first shell 411, and may protrude out of the first opening 412*a* of the first shell 411. In various embodiments, the second support part may not protrude out of the first opening 412*a*. The multiple conductive terminals may be arranged in the second support part, and the ends (e.g., tails) of leads extending from the multiple conductive terminals may be electrically and mechanically connected to multiple lands (e.g., copper pads) arranged on the second printed circuit board 402 using a conductive bonding material (e.g., solder). In case that an external connector is inserted in the first hole 412 of the first shell 411 through the first connector hole 431, the multiple conductive terminals of the external connector and the multiple conductive terminals of the first connector 410 may be in physical contact with and thus electrified with each other. In an embodiment, the first connector 410 may be a type-C socket connector (or a reversible socket connector) which enables a type-C header connector to be connected thereto without the division of the upper side and the lower side thereof. The multiple conductive terminals may include first conductive terminals arranged on one surface of the second support part, and second conductive terminals arranged on the other surface thereof, which is oriented in a direction opposite to the one surface. The first connector 410 may be a USB connector, and for example, the first conductive terminals may include a ground terminal, terminals for supporting high-speed data transmission, terminals for supporting power supply, a channel configuration (CC) terminal, a sideband use (SBU) terminal, or terminals for supporting low-speed data transmission. The second conductive terminals may include terminals for performing the same function as the first conductive terminals, and may be arranged to be opposite to the first conductive terminals. The first connector 410 may support a USB 2.x communication protocol, a USB 3.x communication protocol, or a communication protocol higher than same.

According to an embodiment, the second connector 420 may include a second shell 421 and a second terminal structure 423 coupled to the second shell 421. The second connector 420 may be an audio connector, and for example, may include a socket having a shape to which an audio jack (or a jack plug) having a cylindrical shape and including multiple contact points can be connected. The second shell 421 may include a second hole 422 including a second opening 422*a* facing the second connector hole 432. An external connector (e.g., an audio jack) may be inserted into the second hole 422 of the second shell 421 through the second connector hole 432. The second hole 422 may be a space extending from the second opening 422*a* in the direction (or the direction from the second bezel part 1032 toward the first bezel part 1032) (e.g., the +y-axis direction) in which an external connector is inserted, and may have a shape into which the external connector can be fitted, so that the external connector is stably accommodated therein without shaking. The second shell 421 may include a metal material, may be electrically connected to a ground plane included in the second printed circuit board 402, and thus may function as an electromagnetic shield for reducing electromagnetic interference (EMI) on the second connector 420. In an embodiment, the second shell 421 may include a second hole structure part 421*a* forming the second hole 422, and multiple fixation parts 421*b* extending from the second hole structure part 421*a*. The second hole structure part 421*a* may have a shape which extends in a direction (e.g., the +y-axis direction) in which an external connector is inserted and includes the second hole 422. For example, some fixation parts and the other fixation parts of the multiple fixation parts 421*b* may be symmetrically positioned with reference to the second hole structure part 421*a*, may be inserted into multiple component mounting holes formed through the second printed circuit board 402, and may be coupled to the second printed circuit board 402 using a conductive bonding material. The second shell 421 may be electrically connected to the second printed circuit board 402 through the multiple fixation parts 421*b*. The second shell 421 is not limited to the illustrated example, and may be formed in various other shapes including the second hole 422. The second terminal structure 423 may be disposed on the hole inner surface of the second hole 422, or may include multiple conductive terminals protruding from the hole inner surface of the second hole 422. The second connector 420 may include an insulation member positioned between the metallic second shell 421 and the second terminal structure 423 (or multiple conductive terminals). In various embodiments, the second terminal structure 423 may be implemented to include a portion for insulation with the conductive second shell 421 while supporting multiple conductive terminals. In various embodiments, at least a part of the second shell 421 may include a non-conductive material (e.g., polymer) for insulation with multiple conductive terminals of the second terminal structure 423. The ends (e.g., tails) of leads extending from the multiple conductive terminals may be electrically and mechanically connected to multiple lands (e.g., copper pads) arranged on the second printed circuit board 402 using a conductive bonding material (e.g., solder). In case that an external connector (e.g., an audio jack) is inserted in the second hole 422 of the second shell 421 through the second connector hole 432, the multiple conductive terminals of the second connector 420 may be in elastic contact with and thus electrified with the multiple conductive terminals of the external connector.

According to various embodiments, the second connector 420 may be implemented as a structure into which a tray (or an adapter) can be inserted. An external storage medium may be mounted to the second connector 420 using the tray. The tray may be a device for electrically or mechanically connecting an external storage medium to the second connector 420. An external storage medium may be detached from or attached to the tray. The tray, in which an external storage medium is disposed, may be inserted into the second connector 420 through the second connector hole 432, and multiple terminals of the external storage medium and the multiple terminals of the second connector 420 may be in physical contact with and thus electrified with each other. For example, an external storage medium may include a subscriber identification module (SIM) card or a universal subscriber identification module (USIM) card. For another example, an external storage medium may include a memory card such as a compact flash (CF), a multi-media card (MMC), a smart media card (SMC), a secure disk (SD), or a memory stick (MS).

According to an embodiment, the first seal member 610 may be positioned on the first shell 411 around the first hole

412. The first seal member 610 may have an annular shape (or a closed curved-line shape) extending along the edge of the first opening 412*a*. The second seal member 620 may be positioned on the second shell 421 around the second hole 422. The second seal member 620 may have an annular shape (or a closed curved-line shape) extending along the edge of the second opening 422*a*. The first seal member 610 and the second seal member 620 may be referred to as a flexible member or an elastic member, such as rubber, and for example, may include an O-ring. In various embodiments, the first seal member 610 may be defined as an element included in the first connector 410, and the second seal member 620 may be defined as an element included in the second connector 420. In various embodiments, the first seal member 610 may be implemented in a form integrated with the first shell 411 by insert molding. In various embodiments, the second seal member 620 may be implemented in a form integrated with the second shell 421 by insert molding. In a first assembly operation, the second board assembly 322 including the first connector 410, the second connector 420, and the second printed circuit board 402 may be moved to a designated position of the front case 310. For example, the second printed circuit board 402 may be positioned inside the electronic apparatus 100 to be substantially parallel to the first surface (or the front surface) 110A in FIG. 1 or the second surface (or the rear surface) 110B in FIG. 2. In a second assembly operation, the third support member 313 (e.g., a rear case) may be positioned to cover the second board assembly 322. In a third assembly operation, the rear plate 102 may be coupled to the front case 310. For example, an adhesive material made of various polymers may be positioned between the rear plate 102 and the front case 310. The first assembly operation may include an operation of coupling the second board assembly 322 to the first support member 311 using a fastening element such as a bolt. The second assembly operation may include an operation of coupling the third support member 313 to the second board assembly 322 and/or the first support member 311 using a fastening element such as a bolt. An assembly device may be used in the first assembly operation, the second assembly operation, or the third assembly operation. For example, an assembly device used in the first assembly operation may move the second board assembly 322 while supporting and holding same, and for example, may include a jig or a fixture. An assembly device may reduce assembly errors or assembly defects of the second board assembly 322, and thus may contribute to mass productivity. Through the first assembly operation using an assembly device, the first connector 410 may be aligned to correspond to the first connector hole 431, and the second connector 420 may be aligned to correspond to the second connector hole 432. In case that the second board assembly 322 is disposed at a designated position of the front case 310, the first seal member 610 may be in elastic contact with a designated portion (or a designated area) of the first hole structure 510 (see FIG. 5) forming the first connector hole 431 of the front case 310, and thus the seal performance (e.g., the waterproof performance), which prevents and/or reduces foreign substances such as water or dust from being introduced into the electronic apparatus 100 through a gap between the first connector 410 and the first hole structure 510, may be secured. In case that the second board assembly 322 is disposed at a designated position of the front case 310, the second seal member 620 may be in elastic contact with a designated portion (or a designated area) of the second hole structure 520 (see FIG. 5) forming the second connector hole 432 of the front case 310, and thus the seal performance (e.g., the waterproof performance), which prevents and/or reduces foreign substances such as water or dust from being introduced into the electronic apparatus 100 through a gap between the second connector 420 and the second hole structure 520, may be secured. In various embodiments, an adhesive material made of various polymers may be positioned between the first seal member 610 and the first shell 411 and/or between the second seal member 620 and the second shell 421, to contribute to the seal performance.

According to an embodiment, the second seal member 620 may be positioned closer to the second bezel part 1032 of the lateral bezel structure 103 than the first seal member 610. In various embodiments, according to the shape or the position of the first connector 410 or the second connector 420, the distance in which the first seal member 610 is spaced apart from the second bezel part 1032 in the +y-axis direction, or the distance in which the second seal member 620 is spaced apart from the second bezel part 1032 in the +y-axis direction, may be various.

Figure 8:
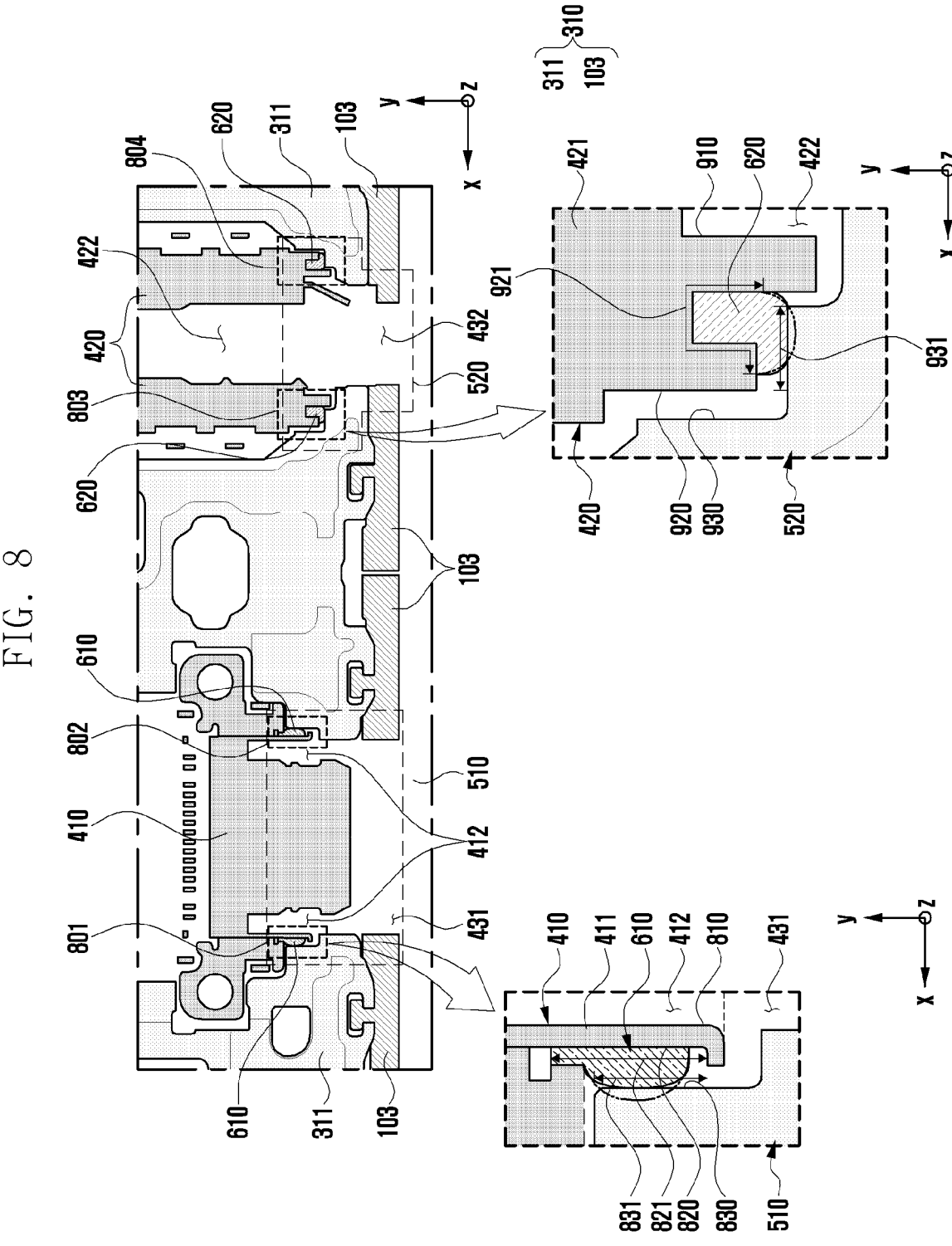
FIG. 8 is a partial cross-sectional view of the x-y plane of the electronic device illustrated in FIG. 5, according to various embodiments.
Figure 9:
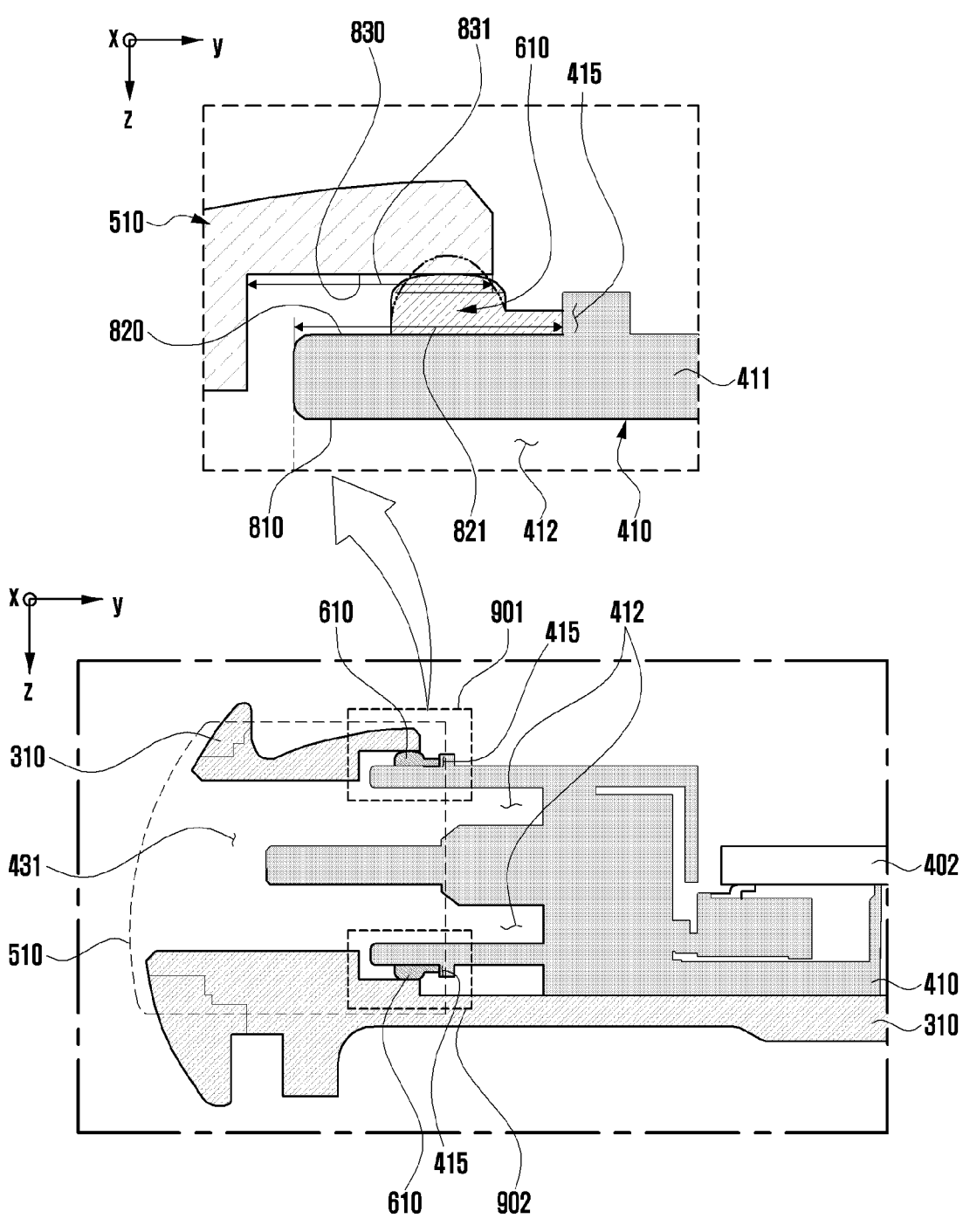
FIG. 9 is a partial cross-sectional view of the y-z plane taken along line A-A' of FIG. 5, according to various embodiments.
Figure 10:
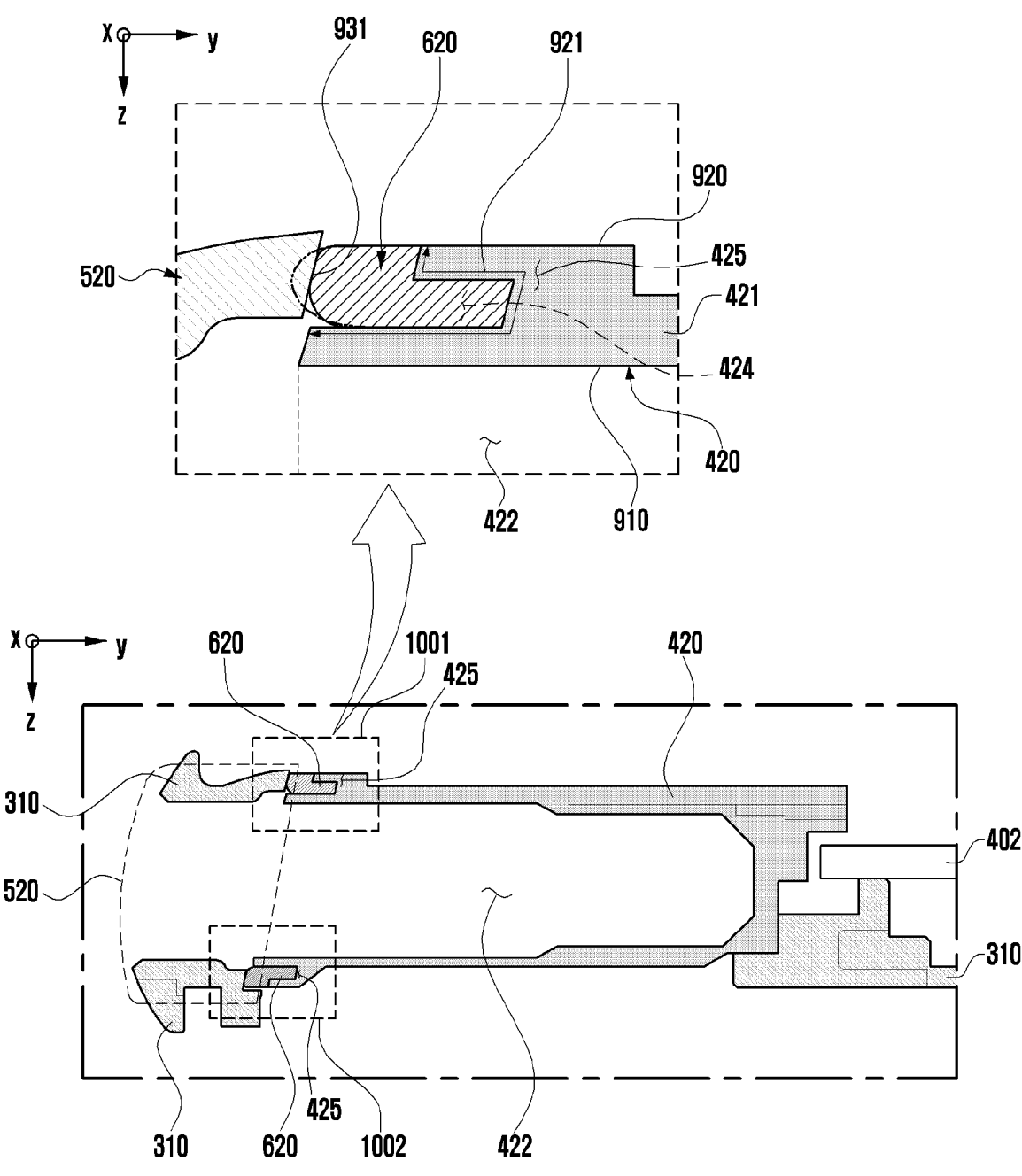
FIG. 10 is a partial cross-sectional view of the y-z plane taken along line B-B' of FIG. 5, according to various embodiments.

FIG. 8 is a partial cross-sectional view of the x-y plane of FIG. 5, according to various embodiments. FIG. 9 is a partial cross-sectional view of the y-z plane taken along line A-A' of FIG. 5, according to various embodiments. FIG. 10 is a partial cross-sectional view of the y-z plane taken along line B-B' of FIG. 5, according to various embodiments.

Referring to FIGS. 8, 9, and 10, in case that the second board assembly 322 (see FIG. 6) is disposed at a designated position of the front case 310, the first connector 410 may be positioned to correspond to the first hole structure 510 forming the first connector hole 431 of the front case 310. The first seal member 610 may be positioned between the first connector 410 and the first hole structure 510, and may be compressed by the first hole structure 510 forming the first connector hole 431. Referring to the portion indicated by reference numeral "801" in the partial cross-sectional view of the x-y plane illustrated in FIG. 8, and the portion indicated by reference numeral "901" in the partial cross-sectional view of the y-z plane illustrated in FIG. 9, the first shell 411 of the first connector 410 may include a shell inner surface (or a hole surface) 810 defining the space of the first hole 412, and a shell outer surface 820 positioned at the side opposite to the shell inner surface 810. For example, at least a part of the shell outer surface 820 may be an annular shape surrounding the first hole 412, and may be oriented in a direction orthogonal to the direction (or, referring to FIG. 4, a direction from the second bezel part 1032 toward the first bezel part 1032) (e.g., the +y-axis direction) in which an external connector is inserted into the first hole 412 of the first connector 410. A part of the first shell 411 may be inserted into the first connector hole 431 of the first hole structure 510. A second area 831 of the hole surface 830 of the first connector hole 431 may surround at least a part of a first area 821 of the shell outer surface 820 of the first shell 411, which is positioned in the first connector hole 431. The first seal member 610 may be at least partially positioned between the first area 821 included in the shell outer surface 820 of the first shell 411 and the second area 831 included in the hole inner surface 830 of the first hole structure 510. In case that the first connector 410 is positioned to be correspond to the first hole structure 510, a gap between the first area 821 and the second area 831 may be smaller than the thickness of the first seal member 610 in a non-compressed state (e.g., see the non-compressed state indicated by the dashed-double dotted line in FIGS. 8 and 9). Due to this, in case that the first connector 410 is positioned to be correspond to the first hole structure 510, the first seal member 610 supported by the first area 821 may be pressed and compressed by the second area 831 corresponding to the first area 821. Hereinafter, the first area 821 may be an area in which the first seal member 610 is disposed, and may be referred to as a first support area (or a first support surface). Hereinafter, in case that the first connector 410 is positioned to be correspond to the first hole structure 510, the second area 831 may be an area for pressing the first seal member 610, and may be referred to as a first pressing area (or a first pressing surface). The first seal member 610 in a compressed state may have a highly close contact force with the first support area 821 and the first pressing area 831, and thus, the seal performance (e.g., the waterproof performance), which prevents and/or reduces foreign substances from being introduced into the electronic apparatus 100 through a gap between the first shell 411 and the first hole structure 510, may be secured. In an embodiment, the first shell 411 may include a protruding part 415 protruding with respect to the shell outer surface 820. The protruding part 415 may be disposed in an annular shape along the first seal member 610. In case that the first connector 410 is positioned to correspond to the first hole structure 510, the protruding part 415 may function as a support part which prevents and/or reduces the first seal member 610 from moving in the +y-axis direction (e.g., the direction in which an external connector is inserted into the first hole 412 of the first connector 410) on the first shell 411. In an embodiment, in case that the second board assembly 322 (see FIG. 6) is disposed in a designated position of the front case 310 and thus the first connector 410 is positioned to correspond to the first hole structure 510 forming the first connector hole 431 of the front case 310, the protruding part 415 may be positioned to be spaced apart from the first hole structure 510 at a height which does not interfere with the first hole structure 510. The protruding part 415 may be implemented as various other types of support parts which are not limited to the illustrated example. For example, the protruding part 415 may include a recess which has an annular shape and into which the first seal member 610 can be fitted. In various embodiments, the first support area 821 and the first seal member 610 may be coupled with a structure such as a dovetail joint. In various embodiments, an adhesive material made of various polymers may be positioned between the first support area 821 and the first seal member 610. In various embodiments, the first pressing area 831 may be formed in various shapes (e.g., a curved-surface) capable of being in close contact with the first seal member 610 without an air gap while pressing first seal member 610. The portion indicated by reference numeral "802" in the partial cross-sectional view of the x-y plane illustrated in FIG. 8 may be formed substantially the same as the portion indicated by reference numeral "801". The portion indicated by reference numeral "902" in the partial cross-sectional view of the y-z plane illustrated in FIG. 9 may be formed substantially the same as the portion indicated by reference numeral "901".

According to an embodiment, the first seal member 610 may be compressed in a first direction by the first hole structure 510 of the front case 310, which forms the first connector hole 431. In the disclosure, for example, in a state where there are a support surface (or a support area) (e.g., the first support area 821 of the first shell 411) for supporting a seal member, and a pressing surface (or a pressing area) (e.g., the first pressing area 831 of the first hole structure 510) for pressing the seal member while at least partially facing the support surface, the direction, in which the seal member is compressed, may be understood as a direction from the pressing surface to the support surface, in other words, a direction based on the relative position relationship of the support surface with respect to the pressing surface. In the disclosure, the direction, in which the seal member is compressed, may be understood as a direction which allows a compressed state of the seal member to be formed, so as to be able to secure the waterproof performance between the support surface and the pressing surface. In various embodiments, the direction, in which the seal member is compressed, may refer, for example, to a direction in which a relatively large or a substantial force causing a compressed state of the seal member is applied, so as to be able to secure the waterproof performance thereof. In the disclosure, it may be understood that the support surface or the pressing surface can be implemented in various forms capable of forming a compressed state of the support member between the support surface and the pressing surface, and for example, can be implemented as a flat surface, a curved-surface, an inclined surface, or a surface combined by at least two thereof. For example, in a partial cross-section of the x-y plane illustrated in FIG. 8, the first direction, in which the first seal member 610 is compressed by the first hole structure 510, may include the x-axis direction orthogonal to the y-axis direction (e.g., the direction in which an external connector is detached from or attached to the first connector 410). In a partial cross-section of the y-z plane illustrated in FIG. 9, the first direction, in which the first seal member 610 is compressed by the first hole structure 510, may include the z-axis direction orthogonal to the y-axis direction. In an embodiment, at least a part of the first support area 821 included in the first shell 411 and at least a part of the first pressing area 831 included in the first hole structure 510 may be substantially parallel while facing each other. In various embodiments, the first support area 821 of the first shell 411 or the first pressing area 831 of the first hole structure 510 may be implemented as a flat surface, a curved-surface, an inclined surface, or a surface combined by at least two thereof. The first seal member 610 supported by the first support area 821 may be compressed in the first direction by the first pressing area 831 so as to be able to secure the waterproof performance.

According to an embodiment, in case that the second board assembly 322 (see FIG. 6) is disposed at a designated position of the front case 310, the second connector 420 may be positioned to correspond to the second hole structure 520 of the front case 310, which forms the second connector hole 432. The second seal member 620 may be positioned between the second connector 420 and the second hole structure 520, and may be compressed by the second hole structure 520. Referring to the portion indicated by reference numeral "803" in the partial cross-sectional view of the x-y plane illustrated in FIG. 8, and the portion indicated by reference numeral "1001" in the partial cross-sectional view of the y-z plane illustrated in FIG. 10, the second shell 421 of the second connector 420 may include a shell inner surface (or a hole surface) 910 defining the space of the first hole 422, and a shell outer surface 920 positioned at the side opposite to the shell inner surface 910. A fourth area 931 of the hole surface 930 of the second connector hole 432 may face a third area 921 of the shell outer surface 920 of the second shell 421, in which the second seal member 620 is disposed. The second seal member 620 may be at least partially positioned between the third area 921 included in the shell outer surface 920 of the second shell 421 and the fourth area 931 included in the hole inner surface 930 of the second hole structure 520. In case that the second connector 420 is positioned to be correspond to the second hole structure 520, a gap between the third area 921 and the fourth area 931 may be smaller than the thickness of the second seal member 620 in a non-compressed state (e.g., see the non-compressed state indicated by the dashed-double dotted line in FIGS. 8 and 10). Due to this, in case that the second connector 420 is positioned to be correspond to the second hole structure 520, the second seal member 620 supported by the third area 921 may be pressed and compressed by the fourth area 931 corresponding to the third area 921. Hereinafter, the third area 921 may be an area in which the second seal member 620 is disposed, and may be referred to as a second support area (or a second support surface). Hereinafter, in case that the second connector 420 is positioned to be correspond to the second hole structure 520, the fourth area 931 may be an area for pressing the second seal member 620, and may be referred to as a second pressing area (or a second pressing surface). The second seal member 620 in a compressed state may have a highly close contact force with the second support area 921 and the second pressing area 931, and thus, the seal performance (e.g., the waterproof performance), which prevents and/or reduces foreign substances from being introduced into the electronic apparatus 100 through a gap between the second shell 421 and the second hole structure 520, may be secured. The second shell 421 may include a recess 424 which has an annular shape and into which the second seal member 620 can be fitted, in the third support area 921. The recess 424 may contribute to a coupling force between the second shell 421 and the second seal member 620. In an embodiment, in case that the second connector 420 is positioned to correspond to the second hole structure 520, the second cell 421 may include a support part 425 which prevents and/or reduces the second seal member 620 from moving in the +y-axis direction (e.g., the direction in which an external connector is inserted into the second hole 422 of the second connector 420) on the second shell 421. The support part 425 may be disposed in an annular shape along the second seal member 620, and may form a part of the third support area 921. The shape of the support part 425 is not limited to the illustrated example, and may be implemented as the protruding part 415 in FIG. 8.

In various embodiments, the second support area 921 and the second seal member 620 may be coupled with a structure such as a dovetail joint. In various embodiments, an adhesive material made of various polymers may be positioned between the second support area 921 and the second seal member 620. In various embodiments, the second pressing area 931 may be formed in various shapes capable of being in close contact with the second seal member 620 without an air gap while pressing the second seal member 620. The portion indicated by reference numeral "804" in the partial cross-sectional view of the x-y plane illustrated in FIG. 8 may be formed substantially the same as the portion indicated by reference numeral "803". The portion indicated by reference numeral "1002" in the partial cross-sectional view of the y-z plane illustrated in FIG. 10 may be formed substantially the same as the portion indicated by reference numeral "1001".

According to an embodiment, in case that the first seal member 610 is compressed in the first direction by the first hole structure 510 of the front case 310, the second seal member 620 may be compressed in a second direction different from the first direction by the second hole structure 520 of the front case 310. The second seal member 620 supported by the second support area 921 of the second shell 421 may be compressed in the second direction by the second pressing area 931 of the second hole structure 520. The second direction, in which the second seal member 620 is compressed by the second hole structure 520, may be understood as a direction which allows a compressed state of the second seal member 620 to be formed, so as to be able to secure the waterproof performance between the second support area 921 and the second pressing area 931. Referring to FIGS. 8 and 10, the second direction, in which the second seal member 620 is compressed by the second hole structure 520, may be a direction based on the relative position of the second support area 921 with respect to the second pressing area 931, and for example, may be orthogonal to the first direction (e.g., the x-axis direction and the z-axis direction) in which the first seal member 610 is compressed by the first hole structure 510. For example, the second direction may be the direction (or, referring to FIG. 4, the direction from the second bezel part 1032 toward the first bezel part 1032) (e.g., the +y-axis direction) in which an external connector is inserted into the second connector 420. A waterproof structure, in which the first seal member 610 positioned in the first connector 410 is compressed in the first direction by the first hole structure 510, and the second seal member 620 positioned in the second connector 420 is compressed in a second direction different from the first direction by the second hole structure 520, may contribute to reducing the occurrence of waterproof defects due to the position deviation (or the position tolerance) between the first connector 410 and the second connector 420 which are arranged on the second printed circuit board 402. In an embodiment, without a substantial effect on the position deviation in the second direction (e.g., the +y-axis direction) between the first connector 410 and the second connector 420 arranged on the second printed circuit board 402, the first seal member 610 supported by the first support area 821 may be compressed in the first direction by the first pressing area 831 so as to be able to secure the waterproof performance. In an embodiment, without a substantial effect on the position deviation in the first direction (e.g., the x-axis direction or the z-axis direction) between the first connector 410 and the second connector 420 arranged on the second printed circuit board 402, the second seal member 620 supported by the second support area 921 may be compressed in the second direction by the second pressing area 931 so as to be able to secure the waterproof performance. According to a comparative example, it will be explained the waterproof defects which may occur in a waterproof structure in which the first direction and the second direction are identically implemented. For example, although not illustrated therein, there may be a first case in which both a first direction in which a first seal member is compressed by a first hole structure, and a second direction in which a second seal member is compressed by a second hole structure, are the +y-axis direction. In the first case, in case that the position deviation (or the position tolerance) in the y-axis direction between the first connector and the second connector is maximum, so as to be able to secure the waterproof performance thereof, the first seal member may be compressed by the first hole structure, but the second seal member may not come into contact with the second hole structure or for the securing of the waterproof performance, may be difficult to be compressed. For another example, although not illustrated therein, there may be a second case in which both a first direction in which a first seal member is compressed by a first hole structure, and a second direction in which a second seal member is compressed by a second hole structure, are the x-axis direction. In the second case, in case that the position deviation in the x-axis direction between the first connector and the second connector is maximum, so as to be able to secure the waterproof performance thereof, one seal member may be compressed by the designated portion of a relevant hole structure, but the other seal member may not be positioned to correspond to the designated portion of the relevant hole structure or for the securing of the waterproof performance, may be difficult to be compressed. For another example, although not illustrated therein, there may be a third case in which both a first direction in which a first seal member is compressed by a first hole structure, and a second direction in which a second seal member is compressed by a second hole structure, are the z-axis direction. In the third case, in case that the position deviation in the z-axis direction between the first connector and the second connector is maximum, so as to be able to secure the waterproof performance thereof, one seal member may be compressed by the designated portion of a relevant hole structure, but the other seal member may not be positioned to correspond to the designated portion of the relevant hole structure or for the securing of the waterproof performance, may be difficult to be compressed.

According to an example embodiment of the disclosure, an electronic apparatus (e.g., the electronic apparatus 100 in FIG. 1) may include a housing (e.g., the housing 110 in FIG. 1). The electronic apparatus may include a first connector (e.g., the first connector 410 in FIG. 4) and a second connector (e.g., the second connector 420 in FIG. 4) positioned on a printed circuit board (e.g., the second printed circuit board 402 in FIG. 4) accommodated in the housing. The first connector may include a first hole (e.g., the first hole 412 in FIG. 6) configured to receive a first external connector. The second connector may include a second hole (e.g., the second hole 422 in FIG. 6) configured to receive a second external connector. The electronic apparatus may include a first seal (e.g., the first seal member 610 in FIG. 6) having an annular shape and positioned on the first connector around the first hole, and a second seal (e.g., the second seal member 620 in FIG. 6) having an annular shape and positioned on the second connector around the second hole. Based on the first seal being compressed in a first direction by the housing, the second seal member may be configured to be compressed in a second direction orthogonal to the first direction by the housing.

According to an example embodiment of the disclosure, the first connector (e.g., the first connector 410 in FIG. 9) may further include a support (e.g., the protruding part 415 in FIG. 9) configured to support the first seal (e.g., the first seal member 610 in FIG. 9) to restrict movement of the first seal member in the first direction. The second connector (e.g., the second connector 420 in FIG. 10) may further include another support (e.g., the support part 425 in FIG. 10) configured to support the second seal (e.g., the second seal member 620 in FIG. 9) to restrict movement of the second seal in the first direction.

According to an example embodiment of the disclosure, the direction (e.g., the +y-axis direction in FIG. 5), in which the first external connector is inserted into the first hole (e.g., the first hole 412 in FIG. 6), may be the same as the direction in which the second external connector is inserted into the second hole (e.g., the second hole 422 in FIG. 6).

According to an example embodiment of the disclosure, the second direction may be the same as the direction in which the second external connector is inserted into the second hole (e.g., the second hole 422 in FIG. 6).

According to an example embodiment of the disclosure, the first seal (e.g., the first seal member 610 in FIG. 7) may be spaced in the second direction (e.g., the +y-axis direction) further than the second seal (e.g., the second seal member 620 in FIG. 7).

According to an example embodiment of the disclosure, the first seal (e.g., the first seal member 610 in FIG. 8) may be at least partially positioned between a first area (e.g., the first area 821 in FIG. 8) of the first connector and a second area (e.g., the second area 831 in FIG. 8) of the housing, and the first area may be positioned to at least partially face the second area and be spaced apart from the second area in the first direction. The second seal (e.g., the second seal member 620 in FIG. 8) may be at least partially positioned between a third area (e.g., the third area 921 in FIG. 8) of the second connector and a fourth area (e.g., the fourth area 931 in FIG. 8) of the housing, and the third area may be positioned to at least partially face the fourth area and be spaced apart from the fourth area in the second direction.

According to an example embodiment of the disclosure, the housing may include a first connector hole (e.g., the first connector hole 431 in FIG. 8) corresponding to the first hole (e.g., the first hole 412 in FIG. 8). The first connector hole may include the second area (e.g., the second area 831 in FIG. 8). The housing may include a second connector hole (e.g., the second connector hole 432 in FIG. 8) corresponding to the second hole (e.g., second hole 422 of FIG. 8). The second connector hole may include the fourth area (e.g., the fourth area 931 in FIG. 8).

According to an example embodiment of the disclosure, the housing may form a front surface (e.g., the front surface 110A in FIG. 1) of the electronic apparatus, a rear surface (e.g., the rear surface 110B in FIG. 2) of the electronic apparatus, and a side surface (e.g., the side surface 110C of FIGS. 1 and 2) of the electronic apparatus, configured to surround at least a part of a space between the front surface and the rear surface. The printed circuit board (e.g., the second printed circuit board 402 in FIG. 4) may be positioned in the housing to be parallel to the front surface or the rear surface. The side surface may be configured to receive the first external connector and the second external connector. The direction, in which the first external connector is inserted into the first hole (e.g., the first hole 412 in FIG. 6), may be the same as the direction in which the second external connector is inserted into the second hole (e.g., the second hole 422 in FIG. 6).

According to an example embodiment of the disclosure, the first connector (e.g., the first connector 410 in FIG. 6) or the second connector (e.g., the second connector 420 in FIG. 6) may be positioned in a notch (e.g., the first notch 403 or the second notch 404 in FIG. 6) formed on the printed circuit board (e.g., the second printed circuit board 402 in FIG. 6).

According to an example embodiment of the disclosure, the printed circuit board (e.g., the second printed circuit board 402 in FIG. 4) may include a first surface (e.g., the first surface 402a in FIG. 5) facing the front surface and a second surface (e.g., the second surface 402b in FIG. 6) facing the rear surface. The first connector (e.g., the first connector 410 in FIG. 6) or the second connector (e.g., the second connector 420 in FIG. 6) positioned in the notch (e.g., the first notch 403 or the second notch 404 in FIG. 6) may protrude with respect to at least one of the first surface and the second surface.

According to an example embodiment of the disclosure, the printed circuit board (e.g., the second printed circuit board 402 in FIG. 4) may include a first surface (e.g., the first surface 402a in FIG. 5) facing the front surface and a second surface (e.g., the second surface 402b in FIG. 6) facing the rear surface. The first connector (e.g., the first connector 410 in FIG. 6) or the second connector (e.g., the second connector 420 in FIG. 6) may be positioned on the first surface or the second surface.

According to an example embodiment of the disclosure, the first connector (e.g., the first connector 410 in FIG. 6) may include a USB connector, and the second connector (e.g., the second connector 420 in FIG. 6) may include an audio connector.

According to an example embodiment of the disclosure, the first connector (e.g., the first connector 410 in FIG. 6) may include a type-C connector.

According to an example embodiment of the disclosure, the first connector (e.g., the first connector 410 in FIG. 4) may include a USB connector, and the second connector (e.g., the second connector 420 in FIG. 4) may include a memory card connector.

According to an example embodiment of the disclosure, the first connector (e.g., the first connector 410 in FIG. 4) may include a USB connector, and the second connector (e.g., the second connector 420 in FIG. 4) may include a connector associated with a SIM card.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic apparatus comprising:
   a housing;
   a first connector comprising a first hole configured to receive a first external connector, and a second connector comprising a second hole configured to receive a second external connector, the first connector and the second connector being positioned on a printed circuit board accommodated in the housing; and
   a first seal having an annular shape and positioned on the first connector around the first hole, and a second seal having an annular shape and positioned on the second connector around the second hole,
   wherein based on the first seal being compressed in a first direction by the housing, the second seal is compressed by the housing in a second direction orthogonal to the first direction,
   wherein the first seal is at least partially positioned between a first area of the first connector and a second area of the housing, and the first area is positioned to at least partially face the second area and be spaced apart from the second area in the first direction, and
   wherein the second seal is at least partially positioned between a third area of the second connector and a fourth area of the housing, and the third area is positioned to at least partially face the fourth area and be spaced apart from the fourth area in the second direction.

2. The electronic apparatus of claim 1, wherein the first connector further comprises a support configured to support the first seal and to restrict the first seal member from moving in the first direction, and
   wherein the second connector further comprises another support configured to support the second seal and to restrict the second seal from moving in the first direction.

3. The electronic apparatus of claim 1, wherein a direction, in which the first external connector is received into the first hole, is the same as a direction in which the second external connector is received into the second hole.

4. The electronic apparatus of claim 3, wherein the second direction is the same as the direction in which the second external connector is received into the second hole.

5. The electronic apparatus of claim 4, wherein the first seal is spaced in the second direction further than the second seal.

6. The electronic apparatus of claim 1, wherein the housing comprises:

a first connector hole comprising the second area and corresponding to the first hole; and a second connector hole comprising the fourth area and corresponding to the second hole.

7. The electronic apparatus of claim 1, wherein the housing includes a front surface of the electronic apparatus, a rear surface of the electronic apparatus, and a side surface of the electronic apparatus, and is configured to at least partially surround a space between the front surface and the rear surface, wherein the printed circuit board is positioned in the housing to be parallel to the front surface or the rear surface, wherein the side surface is configured to receive the first external connector and the second external connector, and wherein the direction, in which the first external connector is received into the first hole, is the same as the direction in which the second external connector is received into the second hole.

8. The electronic apparatus of claim 7, wherein the first connector or the second connector is positioned in a notch formed on the printed circuit board.

9. The electronic apparatus of claim 8, wherein the printed circuit board comprises a first surface facing the front surface and a second surface facing the rear surface, and wherein the first connector or the second connector positioned in the notch protrudes with respect to at least one of the first surface and the second surface.

10. The electronic apparatus of claim 7, wherein the printed circuit board comprises a first surface facing the front surface and a second surface facing the rear surface, and wherein the first connector or the second connector is positioned on the first surface or the second surface.

11. The electronic apparatus of claim 1, wherein the first connector comprises a universal serial bus (USB) connector, and wherein the second connector comprises an audio connector.

12. The electronic apparatus of claim 11, wherein the first connector comprises a type-C connector.

13. The electronic apparatus of claim 1, wherein the first connector comprises a USB connector, and wherein the second connector comprises a memory card connector.

14. The electronic apparatus of claim 1, wherein the first connector comprises a USB connector, and wherein the second connector comprises a connector associated with a subscriber identification module (SIM) card.

* * * * *